United States Patent [19]

Sanchez

[11] Patent Number: 6,081,010
[45] Date of Patent: Jun. 27, 2000

[54] MOS SEMICONDUCTOR DEVICE WITH SELF-ALIGNED PUNCHTHROUGH STOPS AND METHOD OF FABRICATION

[75] Inventor: Julian J. Sanchez, Mesa, Ariz.

[73] Assignee: Intel Corporation, Santa Clara, Calif.

[21] Appl. No.: 08/203,685

[22] Filed: Feb. 28, 1994

Related U.S. Application Data

[63] Continuation of application No. 07/960,542, Oct. 13, 1992, abandoned.

[51] Int. Cl.$^7$ ............................ H01L 29/76; H01L 29/94; H01L 31/062
[52] U.S. Cl. ............................ 257/345; 257/344; 257/408
[58] Field of Search ................................. 257/344, 408, 257/336, 409, 402, 404, 345; 437/44

[56] References Cited

U.S. PATENT DOCUMENTS

| | | | |
|---|---|---|---|
| 4,949,136 | 8/1990 | Jain | 257/344 |
| 5,091,763 | 2/1992 | Sanchez | 357/23.9 |
| 5,218,221 | 6/1993 | Okumura | 257/408 |

OTHER PUBLICATIONS

Kang, et al, "New Transistor Structure Optimization For 0.25um CMOS Technology" *VLSI Symposium Technical Digest* 1991 pp. 85,86.

Wang, P. "Double Boron Implant Short–Channel MOSFET" Mar. 1977, *IEEE Transactions on Electrical Devices*, pp. 196–204.

Hori, et al, "A New Half–Micron p–Channel MOSFET with LATIPS" IEDM 1988, pp. 394–397.

Barnes, et al, "Short–Channel MOSFET's In The Punchthrough Current Mode" *IEEE Transactions on Electrical Devices*, Apr. 1979, pp. 446–452.

Sanchez et al, "Hot–Electron Resistant Device Processing and Design: A Review" *IEEE Transaction on Semiconductor Mfg* Feb. 1989 pp. 1–8.

Pfiester et al, "A Self–Aligned LDD/Channel Implanted ITLDD Process With Selectively–Deposited Poly Gates For CMOS VLSI" *IEEE* 1989 pp. 769–772.

Izawa, et al, "The Impact Of Gate–Drain Overlapped Ldd (Gold) For Deep Submicron VLSI's" *IEDM* 1987 pp. 39–41.

Chen, et al, "Simple Gate–toDrain Overlapped MOSEFET's Using Poly Spacers for High Immunity To Channel Hot–Electron Degradation" *IEEE* 1990, pp. 78–81.

Huang, et al. "A Novel Submicron LDD Transistor With Inverse–T Gate Structure" *IEDM* 1986, pp. 742–745.

Sanchez, et al, "Drain–Engineered Hot–Electron–Resistant Device Structures: A Review" *IEEE Transactions On Electrical Devices*, Jun. 1989, pp. 1125–1132.

Davari,et al, "Submicron Tungsten Gate MOSFET WIth 10nm Gate Oxide", pp. 61–62.

*Primary Examiner*—Steven H. Loke
*Attorney, Agent, or Firm*—Blakely, Sokoloff, Taylor & Zafman LLP

[57] ABSTRACT

A novel high-speed, highly reliable VLSI manufacturable metal oxide semiconductor transistor with self-aligned punchthrough stops. A gate insulating layer is formed on a substrate having a first concentration of a first conductivity type. An inner gate electrode of a predetermined length and width is formed on the gate insulating layer. The inner gate electrode has laterally opposite sidewalls along the width of the inner gate electrode. A first and second punchthrough stop regions of a second concentration of the first conductivity type wherein the second concentration is greater than the first concentration, are disposed in the substrate in alignment with the laterally opposite sidewalls of the inner gate electrode. A pair of conductive spacers adjacent to and in electrical contact with respective laterally opposite sidewalls of the inner gate electrode are formed on the gate insulating layer of the transistor. The conductive spacers, along with the inner gate electrode, form a MOSFET gate electrode. A first source region and a first drain region of a first concentration dopant of a second conductivity type are disposed in the first and the second punchthrough stop regions, respectively, self-aligned with the outer edges of the conductive spacers.

9 Claims, 5 Drawing Sheets

MOS SEMICONDUCTOR DEVICE WITH SELF-ALIGNED PUNCHTHROUGH STOPS AND METHOD OF FABRICATION

This is a continuation of application Ser. No. 07/960,542, filed Oct. 13, 1992, abandoned.

BACKGROUND OF THE INVENTION

1. Field of the Invention

This invention relates to the field of semiconductor devices, and more specifically, to a metal oxide semiconductor field effect transistor (MOSFET) which exhibits excellent punchthrough characteristics, and which can be realized with a VLSI manufacturable process.

2. Discussion of Related Art

In order to fabricate future complex integrated circuits, the basic building block of the integrated circuits, the transistor, must become smaller. Smaller metal oxide semiconductor transistors (MOS) are formed by decreasing the channel length of the transistor. Future MOS transistors will have channel lengths of less than 0.5 $\mu$m. A problem with manufacturing such small channel devices is that the punchthrough voltage of these transistors decreases to an unacceptable level.

The punchthrough voltage of a device is the drain voltage which will cause the drain depletion region of the device to extend into the source depletion region. When this occurs the transistor conducts regardless of the gate voltage. This eliminates the ability of the transistor to act as a switch, i.e. to switch "on" and "off". MOS transistors of less than 1 $\mu$m cannot be fabricated without adjusting to some degree the process recipe to raise the punchthrough voltage of the device.

Presently there are two techniques for adjusting the punchthrough voltage of short channel MOSFET transistors. The first technique, as shown in FIG. 1, employs a double-boron implant of a P type substrate to form an N channel enhancement mode MOSFET. The first boron implant, a threshold implant 12, is a shallow implant of the channel region of the device. The threshold implant raises the threshold voltage of the transistor and prevents surface punchthrough. The second boron implant, the channel implant 14, is a deeper implant of the entire channel region of the transistor. The channel implant prevents bulk punchthrough of the device.

The double-boron implant transistor is undesired because channel implant 14 adversely affects the performance characteristics of the transistor. The channel implant 14 is especially troublesome because it raises the doping at the depletion edge of the device, which affects the device's substrate sensitivity. Additionally, the channel implant adversely affects the sub-threshold slope (gate swing voltage) of the device and also affects threshold voltage.

The second punchthrough voltage adjusting technique is known as LATIPS, and is shown in FIG. 2. The LATIPS transistor employs a large tilt-angle implanted punchthrough stopper (LATIPS). This implant forms higher concentration P type regions 16 under the gate to prevent bulk punchthrough. This implant is generated by tilting and rotating the wafer as the implant occurs. The LATIPS transistor also employs a threshold implant 18 to raise the threshold voltage and to prevent surface punchthrough.

The LATIPS transistor exhibits several undesirable features. First, the P implants 16 do not surround the entire drain. This requires wells to be deeper to prevent well punchthrough, leading to a reduction in packing densities. Second, the LATIPS technology has not been characterized extensively, making its successful use in the manufacturing environment questionable. This is because the rotational aspect of the punchthrough implant provides a doping uniformity which is dependant on the placement, shape, and layout of the fabricated transistor. Additionally, the LATIPS technique requires very specialized and expensive equipment which is difficult to obtain.

Thus, what is needed is a submicron transistor which exhibits excellent punchthrough characteristics without sacrificing other device performance characteristics and which can be fabricated with a VLSI manufacturable process.

SUMMARY OF THE INVENTION

The present invention is a lightly doped drain (LDD) submicron, highly reliable, VLSI manufacturable metal-oxide-semiconductor field effect transistor (MOSFET) which exhibits excellent punchthrough characteristics. A gate insulating layer is formed on a substrate of a first concentration of a first conductivity type. An inner gate electrode of a predetermined length and width is formed on the gate insulating layer. The inner gate electrode has laterally opposite sidewalls along the width of the inner gate electrode. First and Second punchthrough stop regions of a second conductivity of the first concentration type are formed in the substrate in alignment with the laterally opposite sidewalls of the inner gate electrode. A pair of conductive spacers are formed adjacent to and in electrical contact with respective laterally opposite sidewalls of the inner gate electrode on the gate insulating layer. The conductive spacers are formed from either polysilicon, TiN, or some other conductive meterial and together with the inner gate electrode form the MOSFET gate electrode. A first source and a first drain of a first concentration of a second conductivity type are disposed in the first and the second punchthrough stop regions, respectively, self-aligned with the outer edges of the conductive spacers. Oxide spacers are formed adjacent to the outer edges of the conductive spacers. Second source and second drain regions of a second concentration of the second conductivity type are formed in the first source and the first drain regions, respectively, in alignment with the outside edges of the oxide spacers. Silicide is formed on the second source and second drain regions and on the inner gate electrode to decrease the contact resistance of the transistor. A threshold implant region of a third concentration of the first conductivity type is formed at the surface of the channel region of the transistor.

A goal of the present invention is to form a high speed, small channel transistor which exhibits excellent punchthrough characteristics.

Another goal of the present invention is to form a small channel transistor which is resistant to hot electron degradation.

Another goal of the present invention is to form a submicron transistor wherein punchthrough stop regions can be fabricated uniformly across a wafer and from wafer to wafer using standard processing equipment and techniques Still yet another goal of the present invention is to form a transistor where the punchthrough stop regions are self-aligned beneath the gate of the transistor.

BRIEF DESCRIPTION OF THE DRAWINGS

FIG. 4b illustrates the formation of an inner gate electrode member on the substrate of FIG. 4a.

FIG. 4e further illustrates the formation of N− source/drain regions in the substrate of FIG. 4d.

DETAILED DESCRIPTION OF THE PRESENT INVENTION

The present invention is a novel high-speed submicron metal oxide semiconductor transistor which exhibits excellent punchthrough characteristics and which has a VLSI reliable fabrication process. In the following description, numerous specific details are set forth in order to provide a thorough understanding of the present invention. However, it may be obvious to one skilled in the art that the present invention may be practiced without these specific details. In other instances, well-known metal oxide semiconductor transistor concepts and process techniques have not been set forth in detail in order to not unnecessarily obscure the present invention.

The present invention realizes a transistor which can be used in the latest high-density VLSI circuits. The latest VLSI circuits attempt to pack transistors in higher and higher densities. It is, therefore, extremely advantageous to decrease the dimensions of the metal oxide semiconductor field effect transistors in order to increase the transistor density of VLSI circuits. Present MOS transistors in production have channel lengths on the order of one micron. The present invention is an MOS transistor which shows good reliability and performance with channel lengths less than 0.25 microns for 5 volt operation. A problem with producing such small transistors is that the punchthrough voltage of the transistor must be altered (increased) in order to form a reliable transistor.

It is noted that "N+" and "N−" are used throughout the present disclosure. The shorthand notation specifies the electron concentration of various regions of a metal oxide semiconductor device. For instance, "N−" specifies a region of light electron concentration (on the order of $10^{18}/cm^3$) while "N+" specifies a region of high electron concentration ($>10^{19}/cm^3$). It is to be noted that gate length is used in its normal convention to refer to the size of the gate from the source to the drain.

Figure 1:
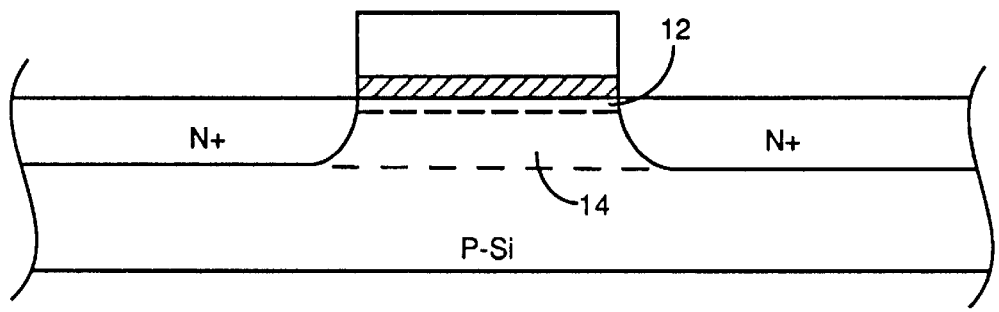
FIG. 1 is a prior art double boron implant short channel MOSFET.
Figure 2:
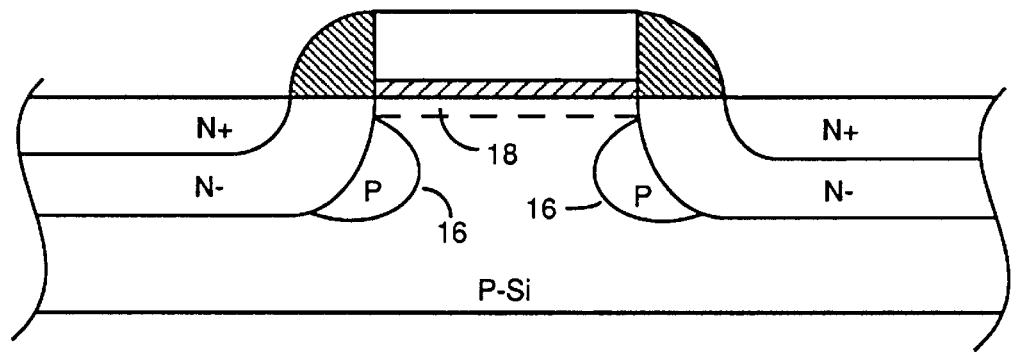
FIG. 2 is a prior art transistor with a large tilt-angle implanted punchthrough stopper (LATIPS).
Figure 3:
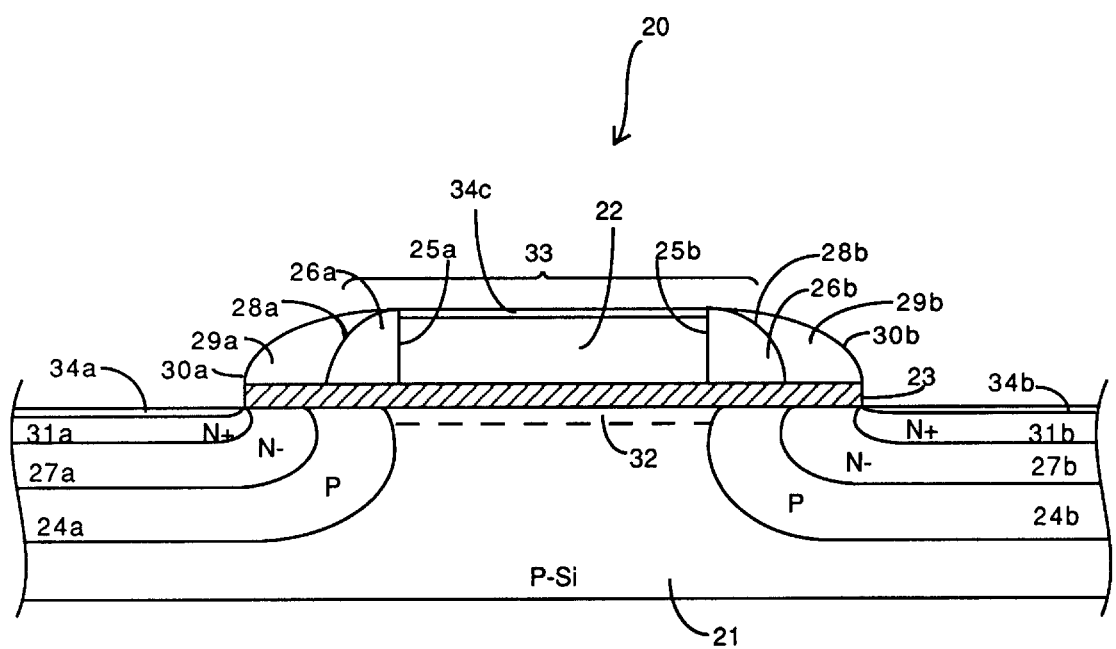
FIG. 3 is a cross sectional view of a LDD MOSFET with self-aligned punchthrough stops of the present invention.

A preferred embodiment of the present invention is shown in FIG. 3. It is a lightly doped drain (LDD) submicron transistor, which exhibits excellent punchthrough characteristics and has resistance to hot electron degradation. The transistor 20 is an N channel enhancement mode MOS transistor fabricated in a P type substrate 21. An inner gate electrode member 22 is formed on a gate oxide layer 23. A pair of P type punchthrough implants 24a and 24b is formed in the P type silicon substrate 21 self-aligned with opposite sides 25a and 25b of the inner gate electrode member 22. Formed adjacent to and coupled to opposite sides 25a and 25b of inner gate member 22 are conductive spacers 26a and 26b. The conductive spacers are formed over gate oxide layer 23. The conductive spacers 26a and 26b, together with the inner gate electrode member 22, form the gate electrode 33 of transistor 20. A first pair of source/drain regions 27a and 27b of N− conductivity are implanted into the punchthrough implants 24a and 24b, respectively, and are self aligned with the outside edges 28a and 28b of the conductive spacers 26a and 26b. The N− source/drain region 27a and 27b provide for a lightly doped drain region. A pair of oxide spacers, 29a and 29b are formed adjacent to the outside edges 28a and 28b of conductive spacers 26a and 26b, respectively. Implanted into the first pair of source/drain regions 27a and 27b, respectively, in alignment with the outside edges 30a and 30b of oxide spacers 29a and 29b, are a second pair of source/drain regions 31a and 31b of N+ conductivity. The N+ source/drain regions 31a and 31b form the source and drain contact regions of transistor 20. A P type implant into the upper surface 32 of the channel region of transistor 20 adjusts the threshold voltage of transistor 20 to a desired value and prevents surface punchthrough. Silicide 34a, 34c and 34b is formed on N+ source/drain regions 31a and 31b and on the inner gate electrode member 22 of transistor 20, respectively, in order to reduce the contact resistance of transistor 20.

The N− and N+ source/drain regions of the present invention form a transistor with a lightly doped drain (LDD) structure. An LDD structure improves the transistors resistance to hot electron degradation, which increases the device's reliability. An LDD structure decreases the peak electric field of the device. The lightly doped drain structure uses both a lower doping and a grading of the drain to reduce the peak electric field. The lightly doped drain structure reduces the electric field for a given voltage by spreading the drain voltage drop over a wider depletion field. The present invention, however, is an improvement over the traditional LDD device in that punchthrough implants are provided. Punchthrough stop regions 24a and 24b increase the punchthrough voltage of the device to greater than 20 volts. The punchthrough stop regions are formed by a punchthrough implant which is formed after the inner gate electrode patterning. Conductive spacers are then formed over the punchthrough implants so that the punchthrough implants are formed beneath the gate and in front of the source/drain regions. This novel method of fabrication allows punchthrough implants to be fabricated with standard processing equipment and with a VLSI tested fabrication process, which yields good doping uniformity and consistency across a wafer and from wafer to wafer.

The N− source/drain regions 27a and 27b are implanted at higher energies into the P type substrate than the N+ source/drain regions 31a and 31b. The high energy implant results in the formation of a sloped junction profile which decreases hot electron injection into the gate. A sloped junction profile results in a drain current which flows away from the surface and is collected by the drain in the bulk.

Since the current is directed away from the surface, the probability of injection into the gate oxide is lowered. In addition, the slope junction separates the maximum current density from the peak electric field further lowering the probability of injection into gate.

The inner gate member 22 is formed over the gate oxide layer 23. The inner gate member 22 provides alignment for the punchthrough stop implant regions 24a and 24b. The inner gate member 22 can be fabricated from either tungsten, polysilicon, or other compatible conductor materials. Tungsten is preferred, however, because tungsten gates are know to increase N channel mobility as well as punchthrough voltages. A tungsten gate also gives the MOS device a higher transconductance (GM) than a polysilicon gate, thereby increasing both the speed and gain of the device.

The performance of the MOSFET of the present invention is further improved by forming silicide on the source, drain and gate of the device as shown in FIG. 3. The transistors performance is improved by reducing its contact resistance. The silicide region 34a and 34b reduce the resistance of the N+ source/drain regions from 20 ohms per square to 4 ohms per square. In order to form silicide on the gate, source, and drain regions of the present invention, oxide spacers provide masking for the conductive spacers 26a and 26b. The masking prevents the gate 33 from becoming shorted to the N+ source/drain regions 31a and 31b by the silicide layer. The oxide spacers 29a and 29b also provide masking for the N+ source/drain region implants.

It is to be appreciated that the transistor 20 shown in FIG. 3 is a symmetrical transistor. That is, the source and drain of the transistor are graded and doped similarly. In normal operation the N+ region 31a or 31b, which is coupled to ground, will be the source of the device, and the N+ region, which is coupled to 5 volts, will be the drain. It is to be understood that the grading and the lower doping of the drain reduces hot electron degradation of the transistor. The source of the transistor does not have the hot electron injection problem of the drain, so neither a lightly doped region nor a grading are required for the source. The source, however, is not significantly hampered by the grading nor the lowered doping so symmetrical devices are manufactured thereby making the transistor more versatile and easier to fabricate.

Figure 4A:
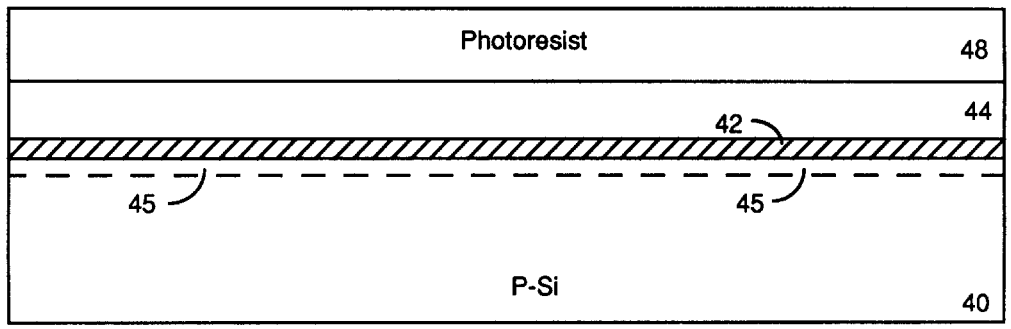
FIG. 4a is a cross sectional view of a P type substrate which includes a gate insulating layer, an inner gate electrode layer, and a photoresist layer.

In the fabrication of the novel submicron metal oxide semiconductor (MOS) device of the present invention a P type silicon substrate 40 shown in FIG. 4a is used. The P type substrate 40 is doped with boron atoms to a level of 10–15 ohms/cm (i.e. to a concentration of about $10^{15}$ atoms/cm$^3$). A relatively low doped P type silicon substrate 40 can be used because the threshold voltage is adjusted by a threshold implant 45 and the punchthrough voltage is adjusted with a punchthrough implant regions 52a and 52b. A low doped substrate translates into fast switching speeds for the device. (Normally higher doped substrates are used to help improve (raise) a device's punchthrough voltage.) An approximately 150Å oxide layer 42 which is used to form the gate insulating layer of the device is grown over the P type substrate 40. In the preferred embodiment the gate oxide layer 42 is grown in a diffusion furnace at 920° C. at atmosphere in 97% O$_2$ and 3% TCA. Next, a threshold implant 45 is made through the gate oxide layer 42 into the surface of the P type silicon substrate. The threshold implant raises the threshold voltage of the device to around 0.6–0.7 v and prevents surface punchthrough. In the preferred embodiment the threshold implant is formed by implanting boron atoms at a dose of $5\times10^{12}$/cm$^2$ and an energy of approximately 30 Kev into the P type silicon substrate 40.

The threshold implant brings the concentration of P type impurities in the silicon substrate near the surface 45 to approximately $10^{17}$ atoms/cm$^3$.

A gate electrode layer 44 is deposited on the oxide layer which will later be formed into an inner gate electrode member for the device. The gate electrode layer 44 can be polysilicon, tungsten, or some other refractory metal. If polysilicon is used it is deposited to a thickness of approximately 3500Å by low pressure chemical vapor deposition (LPCVD) at 615° C. at 130–190 mTorrs in SiH$_4$. The polysilicon is then doped to an N+ conductivity with N-type impurities at a dose of $1\times10^{15}$/cm$^2$ in an ion implanter at an energy of 30 kev. If tungsten is used it is sputtered to a thickness of approximately 1000Å from a tungsten target in Argon at a pressure of approximately 55 mTorr and a power of 6 kw. An approximately one micron thick photoresist layer 48 is deposited on the gate layer 44.

Figure 4B:
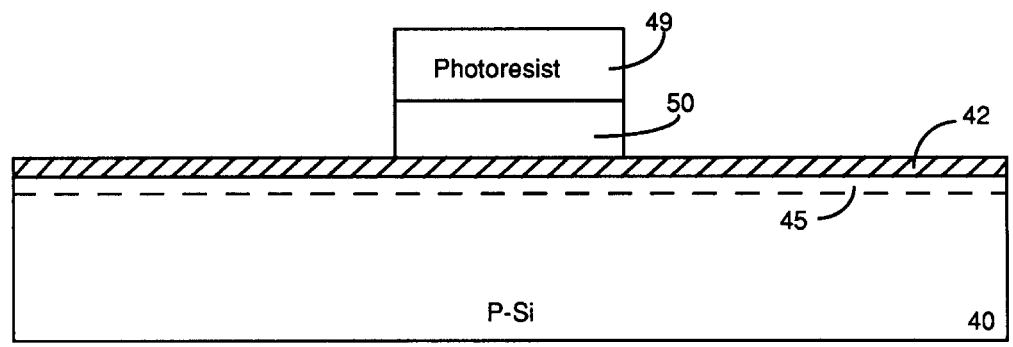

In reference to FIG. 4b, the photoresist layer 48 is masked, exposed and developed with well-known photolithography techniques to define the length and location where the the inner gate electrode member will be formed. The photoresist mask 49 prevents the area 50 of the gate electrode layer 44 under the photoresist mask 49 from being etched. The gate layer 44 is reactive ion etched with an etchant which has a good selectivity over oxide. Because the gate material 44 is different than the oxide layer 42 an end point detection signal is generated at the completion of the inner gate 50 formation. The inner gate member 50 is fully defined once the etch stop signal is generated. If polysilicon is used as the gate electrode layer 44 it is etched by reactive ion etching with Cl$_2$/O$_2$ at a power of approximately 250 watts under pressure of approximately 2.0 Torr for 5 minutes. If tungsten is used, it is etched by Reactive Ion Etching (RIE) at a power of approximately 250 watts and a pressure of 2.0 Torr in CF$_4$/O$_2$ to form a tungsten inner gate member 50.

Figure 4C:
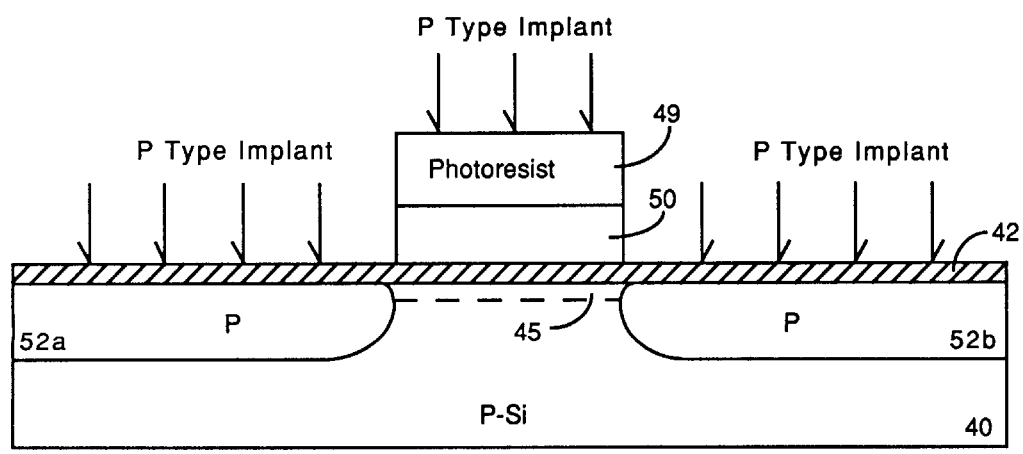
FIG. 4c illustrates the formation of punchthrough stop regions in the substrate of FIG. 4b.

Referring now to FIG. 4c, a P type implant is made to form punchthrough stop regions 52a and 52b. In the preferred embodiment the punchthrough regions are formed deep into the P type substrate 40 by implanting boron atoms at a dose of approximately $1\times10^{13}$/cm$^2$ and an energy between 60 Kev to 120 Kev. This forms punchthrough regions 52a and 52b with a hole concentration of approximately $1\times10^{17}$/cm$^3$ The entire structure is implanted with boron atoms through the oxide layer 42. The photoresist mask 49 prevents the channel region of the P type substrate from becoming more P doped. In this way the punchthrough stop regions 52a and 52b are self-aligned to the laterally opposite outside edges of the inner gate member 50, respectively. This technique ensures that the punchthrough stop regions 52a and 52b are placed exactly where desired without worrying about mask alignment tolerances. It is to be appreciated that the P type implant is formed with standard well-known processing technology wherein the boron atoms are implanted at a 90° angle with respect to the silicon substrate. This standard implant forms punchthrough stop regions 52a and 52b which are uniformly doped across the entire wafer. Additionally, unlike the LATIPS transistor no specialized or uncharacterized equipment or processes are required to form the punchthrough regions 52a and 52b in the present invention.

Figure 4D:
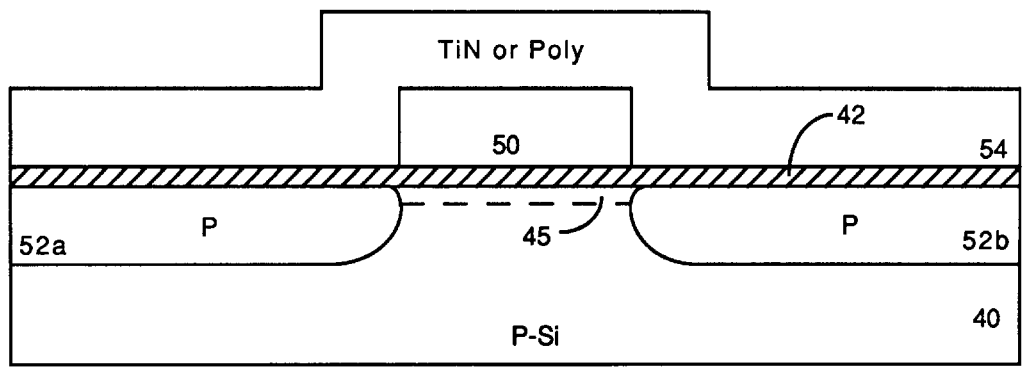
FIG. 4d illustrates the formation of a conformal TiN or polysilicon layer over the substrate of FIG. 4c.

Referring now to FIG. 4d, the photoresist mask 49 is removed by plasma ashing in O$_2$ for 30 minutes. Next a very conformal TiN or polysilicon layer 54 is deposited over the device to form conductive spacers. The TiN or polysilicon layer 54 fully covers the device. If TiN is used, it is sputtered to a thickness of approximately 2000Å from a Ti target in an N₂ ambient at 4 Torrs of pressure and 3 kilowatts of power. The mixture exhibits excellent conformality and is useful in defining spacers. If polysilicon is used, it is formed to a thickness of approximately 2500Å by LPCVD at 615° C. at 130–190 mTorr and SiH₄. In the present invention TiN is the preferred material for the conductive spacers. TiN is formed with a low temperature sputtering process which results in a layer which is very conformal and which has a consistent thickness across the wafer. Polysilicon formation, on the other hand, utilizes a chemical vapor deposition technique which yields a layer which is not as uniform across the wafer. Nonuniform layer thicknesses cause conductive spacers of varying length to be formed across the wafer. TiN spacers are, therefore, preferred to ensure consistent spacer length, reliability, and performance of the fabricated devices.

Figure 4E:
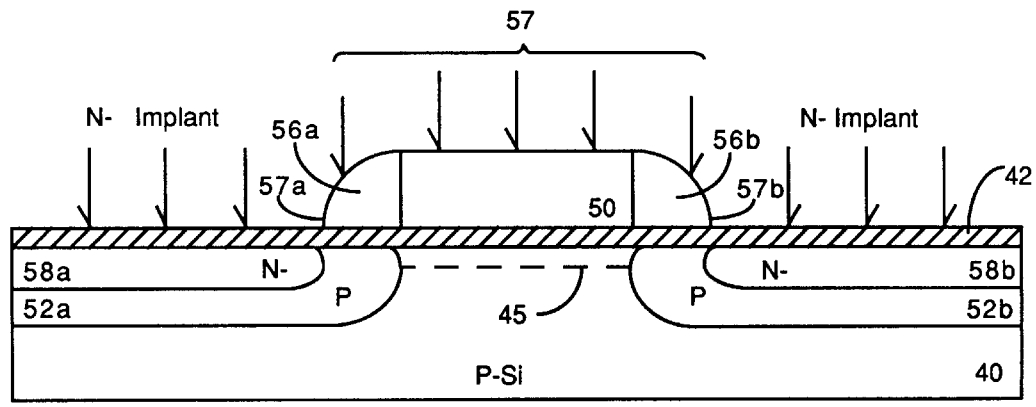
FIG. 4e illustrates the formation of conductive spacers on the substrate of FIG. 4d to form a larger gate which overlaps the punchthrough stop regions.

In FIG. 4e the TiN or polysilicon layer 54 is formed into a pair of conductive spacers 56a and 56b. The TiN or Polysilicon layer 54 is anisotropically etched to form conductive sidewall spacers 56a and 56b about 0.15 microns long. If TiN is used it is etched by reactive ion etching RIE at a pressure of 25 mTorrs in BCl₃ and Cl₂ at flows of 125 sccm and 10 sccm, respectively. A base of approximately 260 volts is maintained as is the hexode temperature of 60° C. The TiN etch is followed by a rapid thermal anneal (RTA) at 1050° C. for 15 seconds in N₂. If Polysilicon is used, it is etched by RIE at 250 watts of power and at a pressure of 200 torr in Cl₂/O2. Both TiN and Polysilicon can be end point detected. Endpoint detection is important to control the amount of over-etching. Over-etching is required when anisotrophic etching is coupled with step topography as in the present case. Controlling the overetching is important to guarantee the correct spacer length and therefore the correct overall gate length.

The conductive sidewall spacers 56a and 56b are formed adjacent to and are coupled to the inner gate electrode member 50, thereby forming a larger gate 57 which is the gate of the MOSFET. In this way, the gate 57 of the transistor overlaps the punchthrough stop regions 52a and 52b. The lightly doped source/drain regions 58a and 58b of the device are self-aligned with the outside edges 57a and 57b of the gate 57 as in standard LDD processing. Because conductive spacers 56a and 56b are used to extend the MOSFET gate electrode 57 over the punchthrough stop implants 52a and 52b, extravagant equipment such as LATIPS implanters are not required to place the implants beneath the gate and in front of the source/drain regions. The conductive spacers 56a and 56b allow a standard implant of ions perpendicular to the substrate surface to be utilized to form the punchthrough stop regions 52a and 52b. The standard implant technique forms uniform and consistent punchthrough stop regions 52a and 52b across a wafer and from wafer to wafer. The technique for forming punchthrough stop regions 52a and 52b in the present invention is a VLSI manufacturable process, unlike the prior art LATIPS technique.

As shown in FIG. 4e, a first source/drain implant is made to form the N– source/drain regions 58a and 58b. Because the conductive spacers 56a and 56b provide masking for the N– implant, the N– source/drain regions 58a and 58b are self-aligned to the outside edges 57a and 57b of the conductive spacers 56a and 56b respectively. This technique guarantees that there is no undesired source/drain to gate offset formed by misalignment. The N– source/drain regions 58a and 58b are formed in the P type punchthrough stop implants 52a and 52b, respectively, by implanting phosphorus atoms at a dose of approximately $5 \times 10^{12}$ atoms/cm² at an energy of approximately 50 Kev. The entire structure is implanted with phosphorus atoms through oxide layer 42. The inner gate member 50 and conductive spacers 56a and 56b prevent the channel region and punchthrough stops from becoming N– doped. Since the N– implant defines the source/drain regions of the device, the N– source/drain regions are self-aligned to the gate 57 of the MOSFET.

Figure 4F:
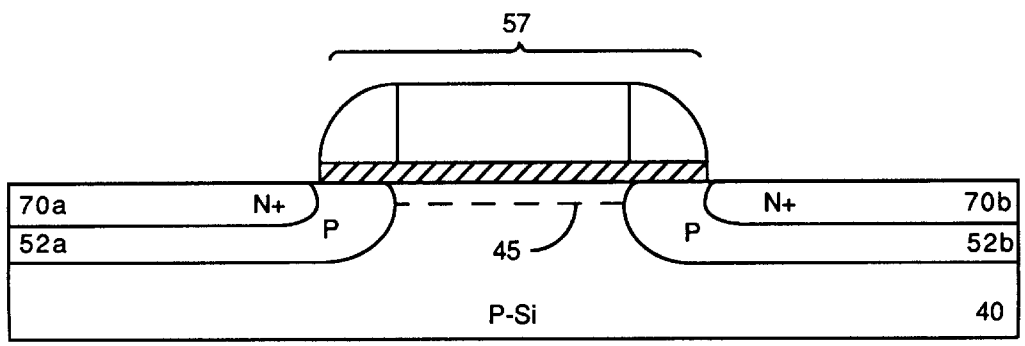
FIG. 4f illustrates a completed N channel MOSFET with self-aligned punchthrough implants.

It is to be appreciated that instead of forming N– source/drain regions 58a and 58b at this time, N+ source/drain regions 70 may be formed instead. This is accomplished by implanting a high dose, on the order of $1 \times 10^{15}$/cm² of N type impurities into the punchthrough stop regions 52a and 52b. As shown in FIG. 4f, the oxide layer 42 would then be etched off the source/drain regions 70a and 70b to form a standard N channel MOSFET with improved punchthrough characteristics. However, because an LDD structure will not be formed, the device would probably suffer from hot electron degradation if short channeled devices are fabricated. Since the goal is to form a highly reliable, manufacturable short channeled device, the preferred embodiment of the present invention forms an LDD structure and not a simple standard MOSFET as shown in FIG. 4f.

Figure 4G:
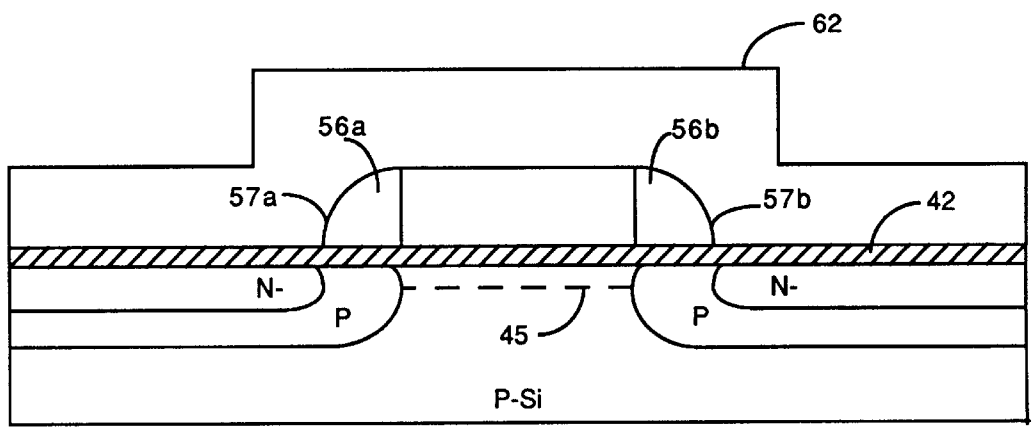
FIG. 4g illustrates the formation of a conformal oxide layer on the substrate of FIG. 4e.
Figure 4H:
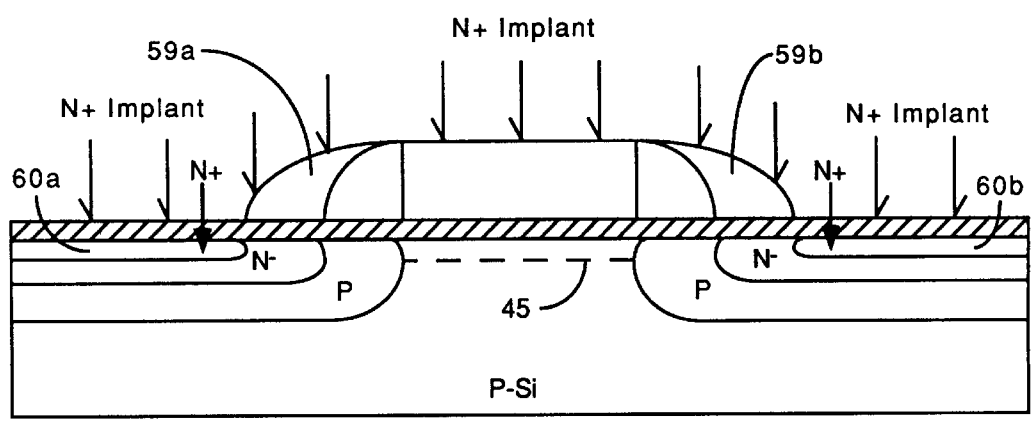
FIG. 4h illustrates the formation of oxide spacers on the substrate of FIG. 4g and the formation of N+ source/drain regions on the substrate of FIG. 4g.

In the preferred embodiment of the present invention a second source/drain implant is made into the substrate of FIG. 4e to form N+ source/drain regions 60a and 60b for the LDD transistor. First, oxide spacers 59a and 59b are formed using well-known techniques. For example, as shown in FIG. 4g, an approximately 4000Å low temperature oxide (LTO) is formed over the device. The LTO layer 62 is then etched anisotropically in CF₄/CHF₃ at a pressure of approximately 3.2 Torr and a power of approximately 1000 watts. The oxide spacers are formed adjacent to the outside edges 57a and 57b of conductive spacers 56a and 56b. Next, as shown in FIG. 4h, the N+ implant is made with arsenic atoms through the gate oxide layer 42 at a dose of approximately $1 \times 10^{15}$/cm² and an energy of approximately 40 Kev. The N+ source/drain regions 60a and 60b are formed in the N– source/drain regions 58a and 58b. The N+ source/drain regions 60a and 60b form the contact regions of the device.

Figure 4I:
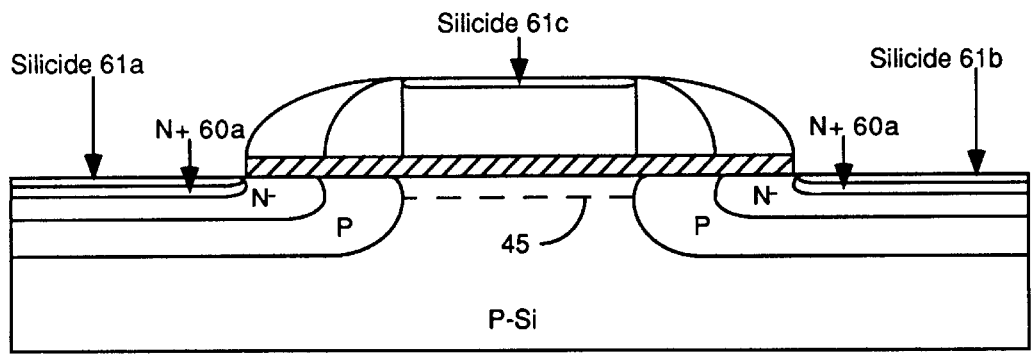
FIG. 4i illustrates the formation of silicide on the N+ source/drain regions and on the inner gate electrode member of the substrate of FIG. 4h.

It is to be appreciated that the LDD MOSFET of the present invention may now be completed by removing the gate oxide layer 42 which exists over the N+ source/drain regions 60a and 60b. The oxide is removed by etching in CF₄/CHF₃ at a power of approximately 1000 watts and at a pressure of approximately 3.2 Torrs for 20 seconds. At this time, other well-know process steps are used to complete the fabrication of the MOSFET. An interlayer dielectric is deposited to separate the gate from the metal layer to follow. Metal contacts are fabricated next to electrically couple the device to other elements in the circuit. A protective glass or passivation is formed over the device to protect the device from contamination and electrical shorts. If desired, the MOSFET may be further processed to increase the device's performance. The performance of the device can be further improved by forming silicide on the contact areas of the device to reduce the contact resistance, as shown in FIG. 4i. The silicide regions 61a, 61b, and 61c are formed with well-known self-aligned techniques. After the removal of the gate oxide layer 42 over the source/drain regions 60a and 60b, titanium silicide (TiSi₂) is formed over the entire device structure. The wafer is then annealed to drive the titanium into the polysilicon gate and the source/drain regions of the device. Reaction only occurs at those areas where titanium silicide is in contact with silicon; everywhere else titanium silicide remains unreacted. The unreacted titanium silicide on the oxide spacers is selectively wet etched so as to leave silicide 61a, 61c, and 61b on the contact regions of the device. The formation of a self-aligned punchthrough implant lightly doped drain MOSFET semiconductor transistor is now complete.

It is to be appreciated that although N channel transistors have been described in detail herein, the present invention may also be practiced as a P channel transistor. In fabricating the P channel self-aligned punchthrough implant MOSFET, the doping conductivities of the P channel device are simply opposite to those of the N channel device. The device is formed in an N type substrate or well with N type punchthrough stop regions, and with P– source/drain regions and P+ source/drain regions formed respectively therein. A tungsten or polysilicon inner gate member would still be utilized. The conductive spacers would be fabricated from polysilicon, TiN, or some compatible conductive layer. Oxide spacers would still be utilized for the alignment and masking of silicide layers and the P+ source/drain implant.

Thus, a novel, high-speed, highly reliable, VLSI manufacturable, small channel LDD MOSFET with self-aligned punchthrough stops has been described.

I claim:

1. A high-speed submicron channel metal oxide semiconductor transistor which exhibits excellent punchthrough characteristics and which is ideal for VLSI circuits, formed on a semiconductor substrate of a first conductivity type having a first concentration comprising:

a gate insulating layer formed on said substrate;

an inner gate electrode of a predetermined length and width formed on said gate insulating layer, said inner gate electrode including laterally opposite sidewalls along said width of said inner gate electrode;

a first punchthrough stop region and a second punchthrough stop region of a second concentration of said first conductivity type wherein said second concentration of said first conductivity type is greater than said first concentration of said first conductivity type, said first punchthrough stop region and said second punchthrough stop region disposed in said substrate in alignment with said laterally opposite sidewalls of said inner gate electrode, respectively;

a first conductive spacer and a second conductive spacer formed on said gate insulating layer over a portion of said first punchthrough stop region and said second punchthrough stop region, respectively, said first conductive spacer and said second conductive spacer adjacent to and in electrical contact with respective laterally opposite sidewalls of said inner gate electrode, said first conductive spacer and said second conductive spacer forming along with said inner gate electrode a MOSFET gate electrode; and a first source region and a first drain region of a first concentration of a second conductivity type disposed in said first punchthrough stop region and said second punchthrough stop region, respectively, self-aligned with the outer edge of said first conductive spacer and said second conductive spacer, respectively.

2. The metal oxide semiconductor transistor of claim 1 further comprising:

a first oxide spacer and a second oxide spacer formed adjacent to the outer edge of said first conductive spacer and said second conductive spacer, respectively;

a second source region and a second drain region of a second concentration of said second conductivity type, wherein said second concentration of said second conductivity type is greater than said first concentration of said second conductivity type, said second source region formed in said first source region, in alignment with the outside edge of said first oxide spacer and said second drain region formed in said first drain region in alignment with the outside edge of said second oxide spacer.

3. The metal oxide semiconductor transistor of claim 2 further comprising silicide formed on said second source region and said second drain region and on said inner gate electrode, said silicide for decreasing the contact resistance of the transistor.

4. The metal oxide semiconductor transistor of claim 3 further including a threshold implant region in the surface of the channel region of said transistor, wherein said threshold implant region has a third concentration of said first conductivity type, said third concentration of said first conductivity type greater than said first concentration of said first conductivity type.

5. The metal oxide semiconductor transistor of claims 1, 2, 3, or 4 wherein said first conductivity type is P type conductivity and said second conductivity type is N type conductivity.

6. The metal oxide semiconductor transistor of claims 1, 2, 3, or 4 wherein said first conductive spacer and said second conductive spacer are polysilicon.

7. The metal oxide semiconductor transistor of claims 1, 2, 3, or 4 wherein said first conductive spacer and said second conductive spacer are titanium nitride.

8. The metal oxide semiconductor transistor of claims 1, 2, 3, or 4 wherein said inner gate electrode is polysilicon.

9. The metal oxide semiconductor transistor of claims 1, 2, 3, or 4 wherein said inner gate electrode is tungsten.

* * * * *